(12) United States Patent
Souetinov

(10) Patent No.: US 6,324,388 B1
(45) Date of Patent: Nov. 27, 2001

(54) IMAGE REJECT MIXER CIRCUIT ARRANGEMENTS

(75) Inventor: Viatcheslav Igor Souetinov, Swindon (GB)

(73) Assignee: Mitel Semiconductor Limited, Wiltshire (GB)

( * ) Notice: Subject to any disclaimer, the term of this patent is extended or adjusted under 35 U.S.C. 154(b) by 0 days.

(21) Appl. No.: 09/390,616

(22) Filed: Sep. 3, 1999

(30) Foreign Application Priority Data

Sep. 8, 1998 (GB) .................................................. 9819428

(51) Int. Cl.[7] ...................................................... H04B 1/10
(52) U.S. Cl. ............................................ 455/302; 455/285
(58) Field of Search ..................................... 455/302, 285, 455/311, 317, 303, 326; 327/116

(56) References Cited

U.S. PATENT DOCUMENTS 5,033,110 * 7/1991 Harman ................................. 455/114

FOREIGN PATENT DOCUMENTS

0782249 A1  12/1996  (EP) .
2239143 A   12/1989  (GB) .

* cited by examiner

*Primary Examiner*—Lee Nguyen
(74) *Attorney, Agent, or Firm*—Kilpatrick Stockton LLP

(57) ABSTRACT

An image reject mixer for a radio receiver comprises transconductors 21 and 22, mixer stages 30 and 23 and a phase shift and combiner circuit 26. The transconductors 21 and 22 provide differential output current signals to their respective mixer stage 30 and 23. Capacitors 28 and 29 are connected between equivalent outputs of the transconductors 21 and 22 respectively. The capacitors 28 and 29 have the effect of correlating the output noise of the transconductors 21 and 22 and correlating the noise generated by the mixer stage transistors which is leaked to the inputs of the mixer stages 30 and 23, the image frequency components of which noise are thereby cancelled by the operation of the mixer stages 30 and 23 and the phase shift and combiner circuit 26. The capacitors 28 and 29 also compensate the second harmonic of the local oscillators which leak through to the inputs of the mixer stages 30 and 23. Overall, gain, noise figure and linearity can all be improved without an increase in current consumption.

7 Claims, 2 Drawing Sheets

IMAGE REJECT MIXER CIRCUIT ARRANGEMENTS

FIELD OF THE INVENTION

The present invention relates to image reject mixer circuit arrangements and in particular, although not exclusively, to image reject mixer circuit arrangements for use in radiotelephone RF receiver circuits.

BACKGROUND OF THE INVENTION

There is a continuing drive in radiotelephone receiver design to improve the linearity characteristics, the power consumption and the noise figure of the receiver circuitry whilst achieving a suitable level of receiver gain. Image reject mixer circuits are commonly used circuit blocks of such receivers. Image reject mixer circuits in which RF input signals are arranged to be fed into first and second parallel paths, associated with in-phase and quadrature local oscillator signals respectively, and subsequently combined are generally preferred to mixer circuits which have a filter to reject image frequency signals. This preference stems from the fact that their noise figure is comparable to that obtained when an ideal image reject filter is used, which of course is not possible, and they tend to take up less chip area and/or involve fewer discrete components than mixer circuits having image reject filters. Whatever type of image reject mixer circuit is used in a radio receiver, its parameters determine the main characteristics of the receiver.

BRIEF SUMMARY OF THE INVENTION

In accordance with a first aspect of the present invention, there is provided an image reject mixer circuit arrangement in which input signals are arranged to be fed into first and second parallel paths, associated with in-phase and quadrature local oscillator signals respectively, and subsequently combined comprising in each path a current signal source circuit arranged to provide from first and second outputs thereof differential current signals, dependent on the input signals, to a mixer stage characterized in having a capacitor connected between the first outputs of the current signal source circuits of the first and second paths.

In accordance with a second aspect of the present invention, there is provided an image reject mixer circuit arrangement comprising:

an input;

first and second current signal source circuits each having an input and first and second outputs;

first and second mixer stages each having first and second signal inputs, a local oscillator signal input and first and second outputs;

a combiner circuit having first to fourth inputs and an output;

a capacitor having first and second electrodes; and an output;

the input being connected to the first current signal source circuit input and to the second current signal source circuit input, the first current signal source first and second outputs being connected to the first mixer stage first and second signal inputs respectively, the second current signal source first and second outputs being connected to the second mixer stage first and second signal inputs respectively, the first mixer stage first and second outputs being connected to the combiner circuit first and second inputs respectively, the second mixer stage first and second outputs being connected to the combiner circuit third and fourth inputs respectively, the combiner circuit output being connected to the output, the capacitor first electrode being connected to the first current signal source circuit first output and the capacitor second electrode being connected to the second current signal source circuit first output.

The current signal source circuits are preferably transconductors but may alternatively be current amplifiers, phase splitters or the like. The primary requirement is that they provide differential current signals dependent on the input signals to their respective mixer stage.

BRIEF DESCRIPTION OF THE DRAWINGS

An embodiment of the present invention will now be described by way of example only with reference to the accompanying drawings, of which.

DETAILED DESCRIPTION OF THE PREFERRED EMBODIMENT

Figure 1:
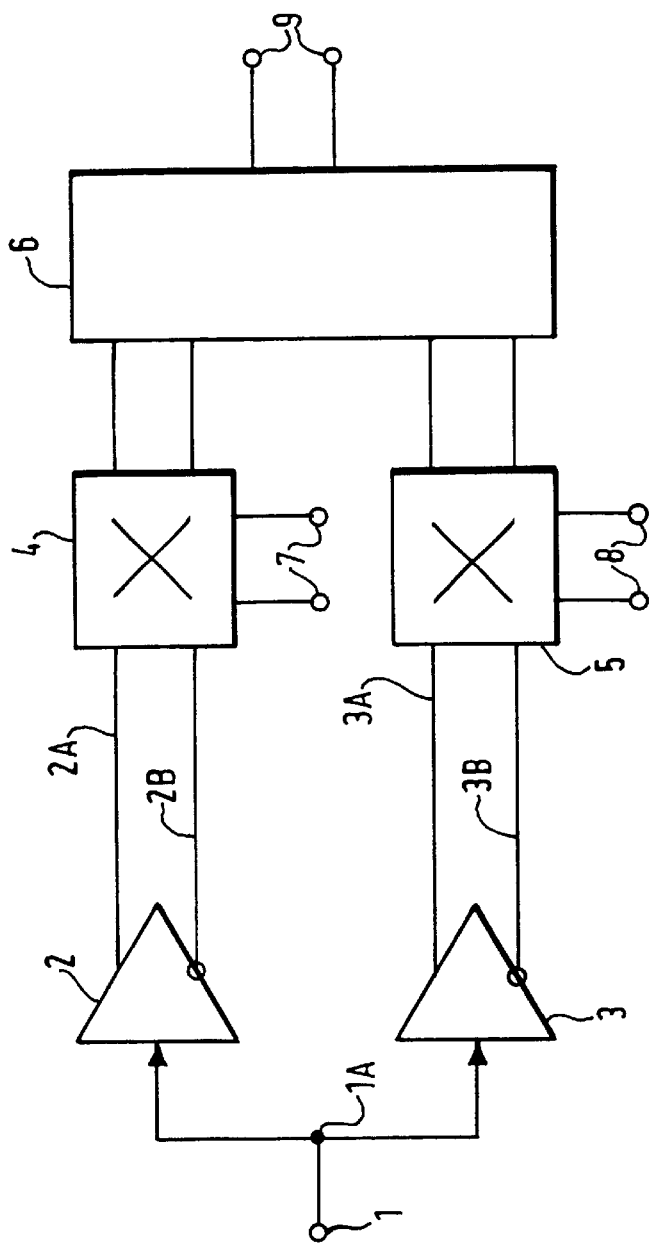
FIG. 1 shows a prior art image reject mixer circuit arrangement.

FIG. 1 shows a popular Gilbert cell based image reject mixer circuit arrangement. The mixer circuit arrangement comprises an input terminal 1 which is connected to signal inputs of both of a first transconductor 2 and a second transconductor 3 by a node 1A. The first transconductor 2 has first and second outputs which are connected to first and second signal inputs respectively of a first mixer stage 4 by respective connections 2A and 2B. The second transconductor 3 has first and second outputs which are connected to first and second signal inputs respectively of a second mixer stage 5 by respective connections 3A and 3B. The first mixer stage 4 is arranged to receive in-phase local oscillator signals at local oscillator input terminals 7. The second mixer stage 5 is arranged to receive quadrature local oscillator signals at local oscillator input terminals 8. Differential output current signals from the first and second mixer stages 4 and 5 are provided to respective ones of first to fourth inputs of a phase shift and combining circuit 6, where they are combined. The combined signals are applied to output terminals 9.

Figure 2:
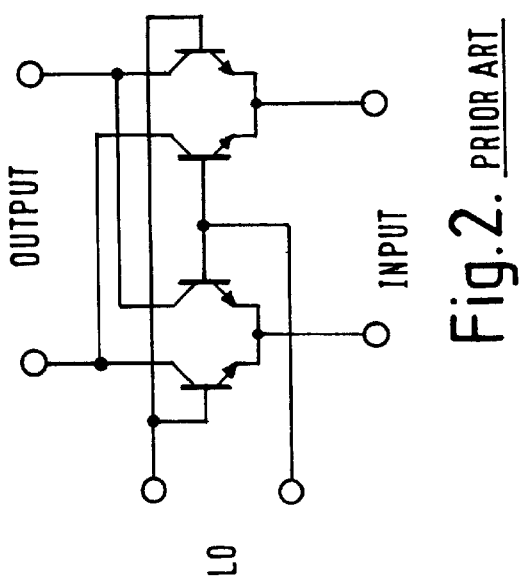
FIG. 2 shows a typical commutation stage, mixer core or mixer stage.

The mixer stages 4 and 5 may each comprise the mixer stage of FIG. 2, although other mixer stages may also be used.

Figure 4:
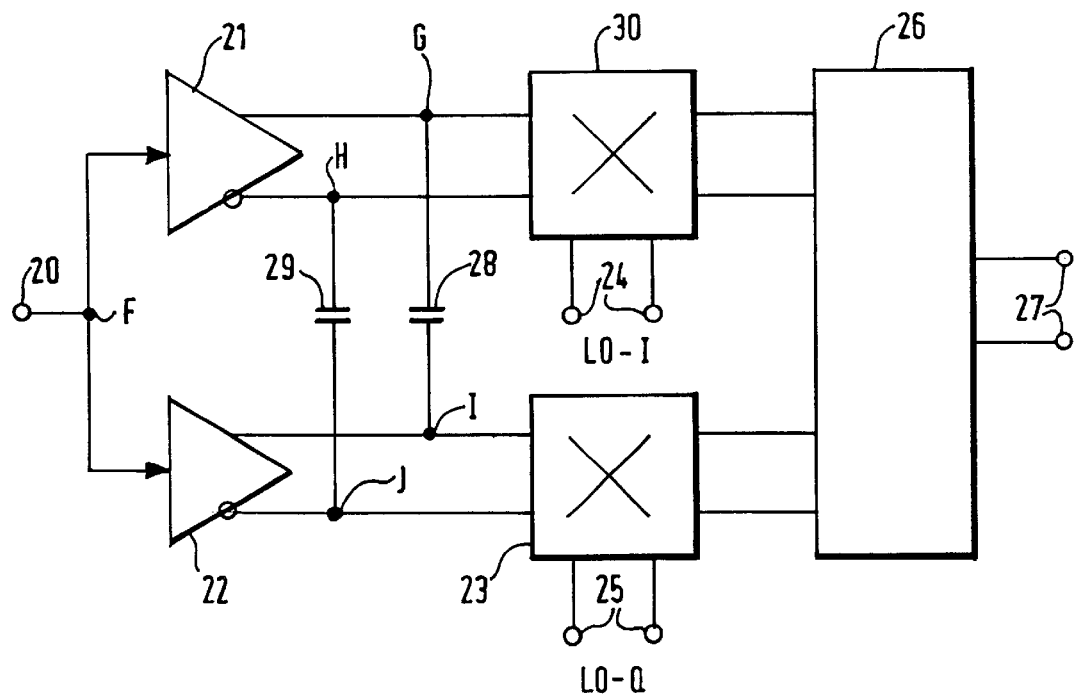
FIG. 4 shows an image reject mixer circuit arrangement in accordance with the present invention.

An analysis of the FIG. 4 image reject mixer circuit arrangement provides basic noise properties of such systems, from which modifications for optimising the circuit arrangement can be derived.

Figure 3:
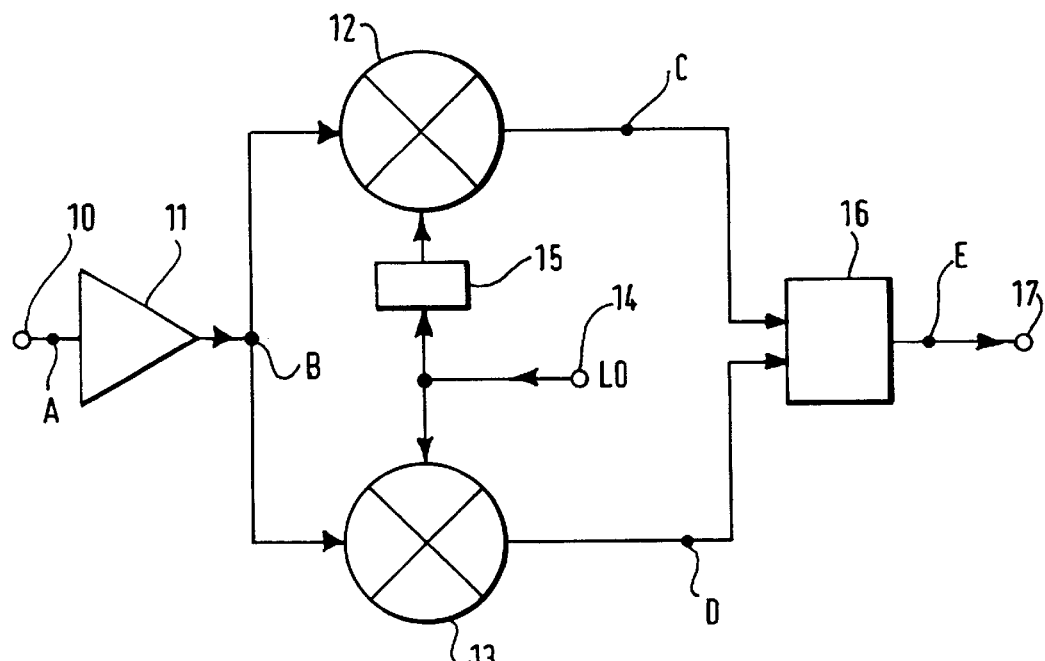
FIG. 3 shows a second prior art image reject mixer circuit arrangement, used to explain noise present in and generated by components within an image reject mixer.

In FIG. 3, an RF input signal applied to a terminal 10 is received and amplified by a low noise amplifier (LNA) 11, a node B at the output of which is connected to signal inputs of both of an in-phase mixer stage 12 and a quadrature mixer stage 13. Local oscillator signals provided at a terminal 14 are applied directly to a local oscillator input of the quadrature mixer stage 13 and, by way of a 90° phase shifter 15, to a local oscillator input of the in-phase mixer stage 12. The outputs of the in-phase mixer stage 12 and the quadrature mixer stage 13 are connected by way of nodes C and D respectively to respective inputs of a phase shift and combining circuit 16, the output of which is connected by a node E to an output terminal 17. The operation of this image reject mixer circuit will be understood by the person skilled in the art.

Assuming that the phase shift and combiner circuit 16 is noiseless, the noise present at points throughout the circuit can be calculated as follows:

The noise power at node B is:

$$N_{LNAt} = N_S A_P + N'_S A'_P + N_{LNA} + N'_{LNA} \qquad (1)$$

where ...

$N_S$, $N'_S$=Source noise at the wanted and image frequencies, respectively;

$A_P$, $A'_P$=LNA power gain at the wanted and image frequencies, respectively; and $N_{LNA}$, $N'_{LNA}$=Noise due to the LNA circuit at the wanted and image frequencies respectively.

The noise power at the outputs of each of the in-phase and quadrature mixer stages 12 and 13 (nodes C and D) is ...

$$N_{PQ} = \frac{1}{2}(N_S A_P + N_{LNA})G_P + N_M + \frac{1}{2}(N'_S A'_P + N'_{LNA})G'_P + N'_M \qquad (2)$$

where ...

$N_M$, $N'_M$=Noise due to the mixer stages 12 and 13 at wanted and image frequencies, respectively; and $G_P$, $G'_P$=Power gain at the mixer stages 12 and 13 respectively.

It should be noted that the factor of ½ in equation (2) reflects the fact that the signal power at the output of the LNA is equally divided between the in-phase mixer stage 12 and the quadrature mixer stage 13.

Noise from the source and from the LNA 11 at the output of the in-phase mixer stage 12 will be correlated with noise from the source and from the LNA 11 at the output of the quadrature mixer stage 13. However, noise generated in the mixer stages 12 and 13 will not be correlated. Therefore, when the signals from the in-phase and quadrature mixer stages 12 and 13 are summed, the noise currents from the source and LNA 11 at the signal frequency are summed, noise from the source and from the LNA 11 at the image frequency are rejected, and noise power from the in-phase mixer stage 12 and the quadrature mixer stage 13 is summed. Therefore, after summation (at node E), the total output noise power is ...

$$N_{tot} = 2N_S A_P G_P + 2N_{LNA} G_P + 2(N_M + N'_M) \qquad (3)$$

Hence the noise figure ...

$$NF = \frac{N_{tot}}{2N_S A_P G_P} = 1 + \frac{N_{LNA}}{N_S A_P} + \frac{1}{A_P}\left(\frac{N_M + N'_M}{N_S G_P}\right) \qquad (4)$$

$$= NF_{LNA} + \frac{1}{A_P}(NF_{SSB} - 1)$$

where ...

$$NF_{LNA} = 1 + \frac{N_{LNA}}{N_S A_P} \qquad (5)$$

$$NF_{SSB} = 1 + \frac{N_M + N'_M}{N_S G_P}$$

It should be noted that the final expression above (4), is the same result as would be obtained for a conventional system of the same overall conversion gain and linearity performance with an ideal image frequency signals rejecting filter between the LNA and mixer.

In practice the input transconductor can have common blocks for both I and Q mixers. In this case the noise generated in the common block is correlated and hence the image part of the noise will be rejected. The theory suggests therefore that an image reject mixer can achieve a better noise figure if the input transconductor is common for both mixer stages.

It is more convenient however to use a separate transconductor for each mixer stage. Such an arrangement does not suffer from problems caused by DC mismatch, which is inevitable when mixer stages are DC connected to a single transconductor. Even a small DC mismatch between the inputs of the mixer stages will result in unbalanced DC currents in these stages. This will result in leakage of RF and local oscillator frequency signals to the mixer output and will also increase noise flow from the local oscillator path.

In FIG. 4, in an image reject mixer circuit arrangement in accordance with the present invention, an input terminal 20 is connected to signal inputs of both of a first transconductor 21 and a second transconductor 22 by a node F. The first transconductor 21 has first and second outputs which are connected to first and second signal inputs respectively of a first mixer stage 30 by a respective one of first and second nodes G and H. The second transconductor 22 has first and second outputs which are connected to first and second signal inputs respectively of a second mixer stage 23 by a respective one of third and fourth nodes I and J respectively. The mixer stage 30 is arranged to receive in-phase local oscillator signals at local oscillator input terminals 24. The mixer stage 23 is arranged to receive quadrature local oscillator signals at local oscillator input terminals 25. Differential output current signals from the first and second mixer stages 30 and 23 are provided to respective ones of first to fourth inputs of a phase shift and combining circuit 26, where they are combined. The combined signal is applied to output terminals 27. A first capacitor 28 is connected between the nodes G and I, corresponding to the first outputs of the first and second transconductors 21 and 22, and a second capacitor 29 is connected between nodes H and J, corresponding to the second outputs of the first and second transconductors 21 and 22. The first outputs of the first and second transconductors 21 and 22 are equivalent to each other, as are the second outputs.

Each of the transconductors 21 and 22 converts the RF single ended voltage signal received at the terminal 20 and provides in dependence thereon differential output current signals on its respective first and second outputs. The current signal provided on the first output of a one of the first and second transconductors is in anti-phase to the signal provided on the second output of that transconductor. Also, because the transconductors 21 and 22 receive the same input signal and have the same internal configuration, the signals provided on their respective outputs are approximately the same as those provided on the equivalent output of the opposite transconductor 21 and 22. The operation of the mixer stages 30 and 23 and the phase shift and combiner circuit 26 is conventional.

The connection of the capacitors 28 and 29 between the first outputs and the second outputs respectively of the transconductors 21 and 22 has a number of positive effects on the operation of the image reject mixer circuit, as explained below:

The capacitors 28 and 29 cause the output noise of the transconductors 21 and 22 to become correlated. They also cause the noise generated at the signal inputs of the mixer stages 30 and 23 by the transistors within them to become correlated. The components of the noise from both of these sources which are at the image frequency will thus be rejected by the operation of the mixer stages 30 and 23 and the phase shift and combining circuit 26. Also, the power of the second harmonics of the local oscillator frequency that is leaked through to the signal inputs of the mixer stages 30 and 23 is significantly reduced. This is because the second harmonics produced by the in-phase and quadrature local oscillator signals in the mixer stages 30 and 23 appear at the signal inputs of the mixer stages 30 and 23 respectively 180° out of phase. The capacitors 28 and 29 compensate the second local oscillator harmonic signals which appear across them to reduce their amplitude. In conventional image reject mixer circuits, the second harmonic of the local oscillator frequency disturbs significantly the switching of the transistors within the mixer stages and leads to gain degeneration, especially at high frequencies.

The inclusion of the capacitors 28 and 29 thus result in an improvement in the overall conversion gain, the noise figure and the third order intercept point of the image reject mixer circuit arrangement. The extent of these improvements increases as the local oscillator frequency increases. For radio receivers operating at 900 or 1800 MHz, optimum performance will be achieved by the inclusion of capacitors 28 and 29 having a value in the range of 0.5 to 4.0 pF. However, the value of capacitors 28 and 29 needed to provide optimum benefit will depend particularly on the frequency of the RF input signal and the particulars of the image reject mixer circuit's design. The inclusion of the capacitors 28 and 29 into the image reject mixer circuit arrangement does not increase the overall current consumption of the circuit.

What is claimed is:

1. An image reject mixer circuit arrangement in which input signals are arranged to be fed into first and second parallel paths, associated with in-phase and quadrature local oscillator signals respectively, and subsequently combined comprising in each path a current signal source circuit arranged to provide from first and second outputs thereof differential current signals, dependent on the input signals, to a mixer stage characterised in having a capacitor connected between the first outputs of the current signal source circuits of the first and second paths.

2. A mixer circuit arrangement in accordance with claim 1 further comprising a second capacitor connected between the second outputs of the current signal source circuits of the first and second paths.

3. A mixer circuit arrangement in accordance with claim 1 in which the current signal source circuits are transconductor circuits.

4. A radio receiver including an image reject mixer circuit arrangement in accordance with claim 1.

5. A radiotelephone including a radio receiver in accordance with claim 4.

6. An image reject mixer circuit arrangement comprising:

an input;

first and second current signal source circuits each having first and second outputs;

first and second mixer stages each having first and second signal inputs, a local oscillator signal input and first and second outputs;

a combiner circuit having first to fourth inputs and an output;

a capacitor having first and second electrodes; and an output; the input being connected to the first current signal source circuit input and to the second current signal source circuit input, the first current signal source first and second outputs being connected to the first mixer stage first and second signal inputs respectively, the second current signal source first and second outputs being connected to the second mixer stage first and second signal inputs respectively, the first mixer stage first and second outputs being connected to the combiner circuit first and second inputs respectively, the second mixer stage first and second outputs being connected to the combiner circuit third and fourth inputs respectively, the combiner circuit output being connected to the output, the capacitor first electrode being connected to the first current signal source circuit first output and the capacitor second electrode being connected to the second current signal source circuit first output.

7. An arrangement, in accordance with claim 6, further comprising a second capacitor having first and second electrodes, the second capacitor first electrode being connected to the first current signal source second output and the second capacitor second electrode being connected to the second current signal source second output.

\* \* \* \* \*